(12) United States Patent
Havens et al.

(10) Patent No.: US 6,313,680 B1
(45) Date of Patent: Nov. 6, 2001

(54) PHASE SPLITTER

(75) Inventors: Joseph Harold Havens, Tokyo (JP); Bruce Walter McNeill, Allentown, PA (US); M. T. Homer Reid, Tokyo (JP)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/493,287

(22) Filed: Jan. 28, 2000

(51) Int. Cl.[7] .............................. H03H 11/16; H03H 3/00; H03H 5/13

(52) U.S. Cl. .................. 327/244; 327/236; 327/238; 327/254

(58) Field of Search .................... 327/236, 237, 327/238, 239, 243, 244, 245, 246, 247, 254, 256

(56) References Cited

U.S. PATENT DOCUMENTS

| | | | |
|---|---|---|---|
| 4,908,532 | * 3/1990 | Chadwick | 327/236 |
| 5,105,168 | * 4/1992 | DaSilva | 331/2 |
| 5,608,796 | 3/1997 | Banu et al. | 379/403 |
| 5,635,863 | * 6/1997 | Price, Jr. | 327/3 |
| 5,963,073 | * 10/1999 | Fujita et al. | 327/254 |
| 6,137,999 | * 10/2000 | Lovelace et al. | 455/302 |
| 6,157,235 | * 12/2000 | Bautista et al. | 327/254 |

\* cited by examiner

*Primary Examiner*—Terry D. Cunningham
*Assistant Examiner*—Quan Tra
(74) *Attorney, Agent, or Firm*—Oliff & Berridge, PLC

(57) ABSTRACT

This invention provides a phase splitter device that generates in-phase and quadrature outputs that have a phase difference of substantially a phase set value (e.g., 90°) and an amplitude difference of substantially an amplitude set value (e.g., zero). A first feedback loop controls the phase difference between the in-phase and the quadrature outputs while a second feedback loop controls the amplitude difference between the in-phase and quadrature outputs. The phase splitter device controls the amplitude difference and the phase difference between the in-phase and the quadrature outputs by a common mode of control signals and a differential between the control signals, respectively. In this way, the phase splitter device generates in-phasing and quadrature outputs that have a phase difference and an amplitude difference that is substantially equal to the amplitude and phase set values (e.g., zero and 90°) using a single set of control signals.

13 Claims, 10 Drawing Sheets

PHASE SPLITTER

BACKGROUND OF THE INVENTION

1. Field of Invention

This invention relates to phase splitters.

2. Description of Related Art

Phase splitters are required in a variety of applications. For example, in quadrature modulation, a phase splitter is used to split a local oscillator signal into sine and cosine components which are then mixed against in-phase and quadrature signal inputs to produce a single-side band output signal. With increasing demand for wireless services within limited bandwidths, higher performance phase splitters are required. Thus, new technology is needed to improve phase splitters.

SUMMARY OF THE INVENTION

This invention provides a phase splitter device that generates in-phase and quadrature outputs from an input signal. A first feedback loop of the phase splitter device ensures that a phase difference between the in-phase and quadrature outputs may be substantially a first set value (e.g., 90°). A second feedback loop of the phase splitter ensures that a difference between amplitudes of the in-phase and quadrature outputs may be substantially a second set value (e.g., zero).

The first feedback loop controls the phase difference between the phase of the inphase output and the phase of the quadrature output by generating a phase compare signal that is proportional to the phase difference. The phases of the in-phase and the quadrature outputs are adjusted until the phase difference is substantially equal to the first set value. The second feedback loop controls the amplitudes of the in-phase and quadrature outputs by generating an amplitude compare signal that is proportional to the difference between the amplitudes. The amplitudes are adjusted until the difference between the amplitudes is substantially equal to the second set value.

The in-phase output may be generated by a generator such as a high pass filter while the quadrature output may be generated by a generator such as a low pass filter, for example. Each of the generators may be controlled by a single control signal. The phase splitter device controls the amplitude difference and the phase difference between the in-phase and the quadrature outputs by a common mode of the control signals and a differential between the control signals, respectively. In this way, the phase splitter device generates in-phasing and quadrature outputs that have a phase difference and an amplitude difference that is substantially equal to the first and second set values (e.g., zero and 90°) using a single signal for the in-phase and quadrature output generators.

BRIEF DESCRIPTION OF THE DRAWINGS

The invention is described in detail with reference to the following figures wherein like numerals reference like elements, and wherein.

DETAILED DESCRIPTION OF PREFERRED EMBODIMENTS

Figure 1:
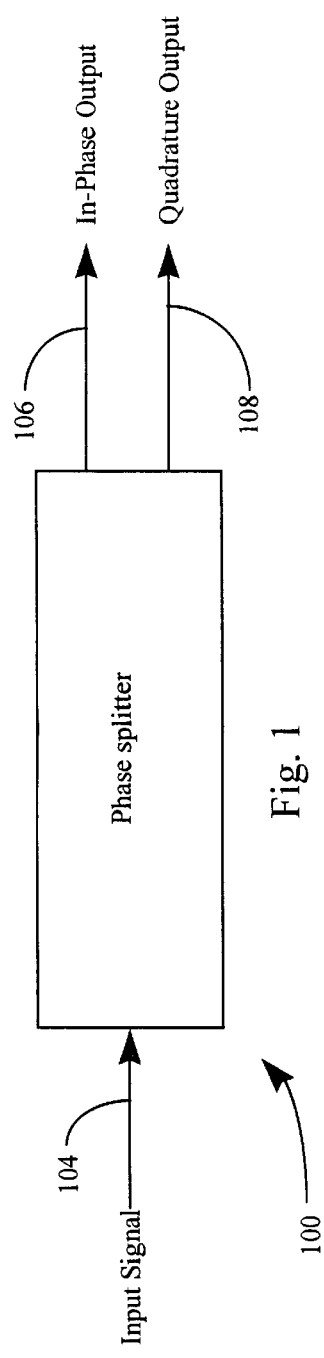
FIG. 1 shows an exemplary block diagram of a phase splitter.

FIG. 1 shows an exemplary block diagram of a phase splitter 100 having an input port 104 receiving an input signal and two output ports 106, 108 outputting in-phase and quadrature outputs. The phase splitter 100 generates the in-phase and quadrature outputs that have a phase difference of 90° based on the input signal.

Figure 2:
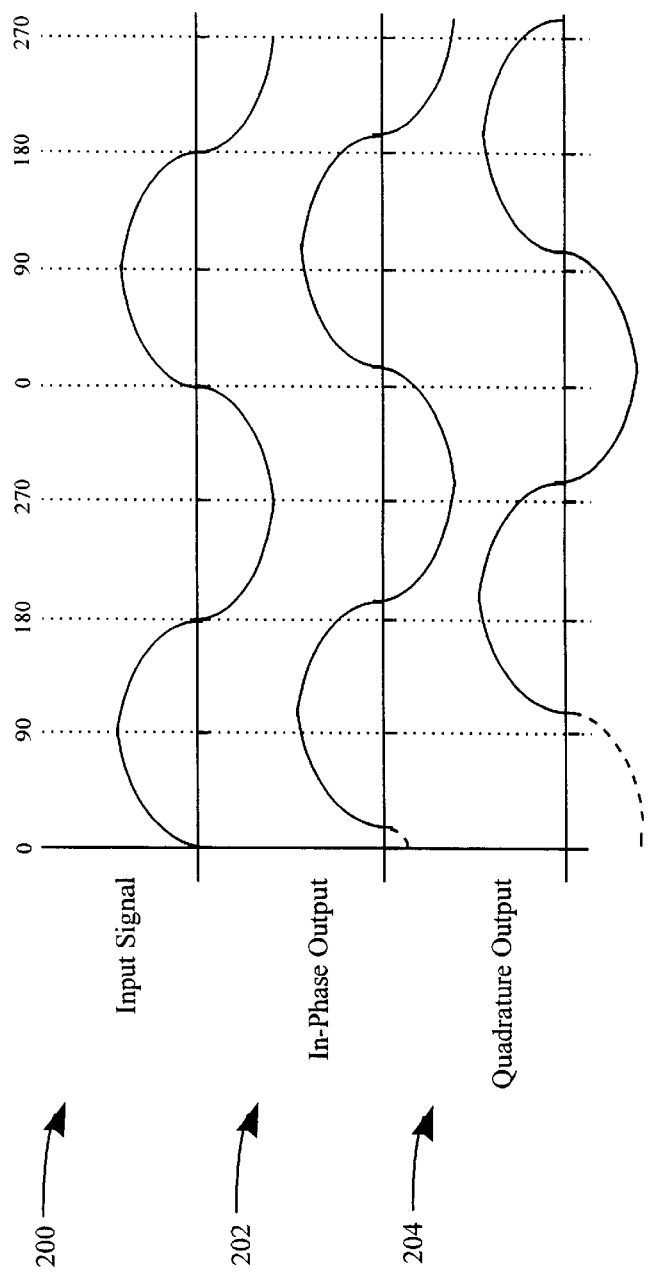
FIG. 2 shows exemplary waveforms for in-phase and quadrature outputs corresponding to an input signal.

FIG. 2 shows three signal diagrams 200, 202 and 204 indicating the phase relationships among the input signal, the in-phase output and the quadrature output. The in-phase output may be identical with the input signal and the quadrature output may be 90° phase shifted from the in-phase output. The phase splitter 100 may introduce a delay so that the in-phase output may be phase shifted from the input signal as is shown in FIG. 1. However, the in-phase and the quadrature outputs should always have a phase difference of about 90°.

While the phase splitter 100 may be designed to output in-phase and quadrature outputs to have a same amplitude and about 90° apart in phase, actual phase splitter devices often generate in-phase and quadrature outputs having different amplitudes and phase differences of other than 90° due to component value tolerances or physical layout consequences of the phase splitter in both integrated circuit and printed circuit board implementations, for example. This invention provides a phase splitter device which ensures that the in-phase and quadrature outputs have substantially the same amplitudes and a phase difference of substantially 90°. In this way, high quality phase splitters 100 may be easily produced without the phase splitter performance being highly dependent on extreme care in circuit layout and component matches between in-phase and quadrature generator circuits.

Figure 3:
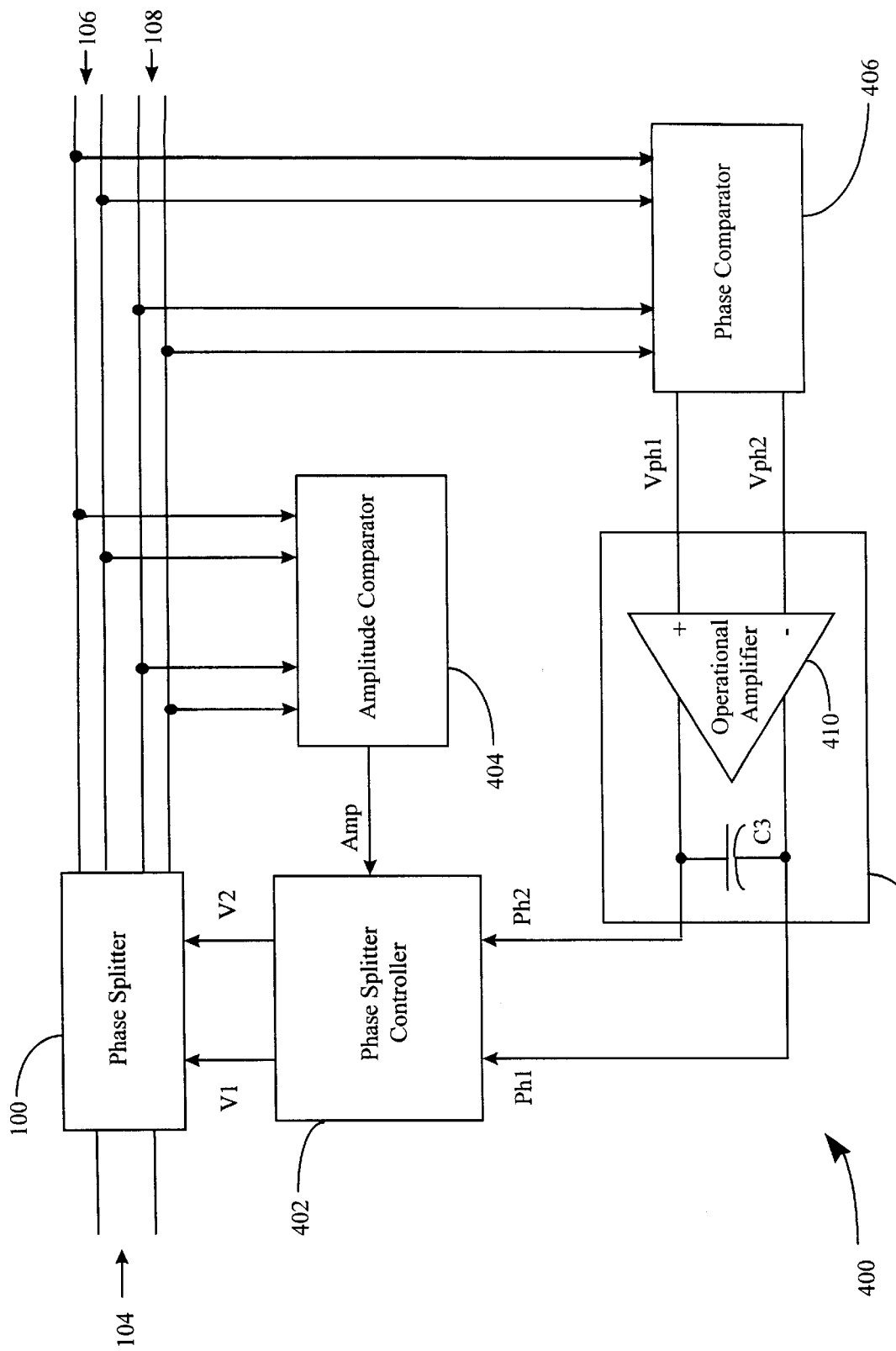
FIG. 3 shows a block diagram for a phase splitter device.

FIG. 3 shows an exemplary block diagram of a phase splitter device 400 that includes the phase splitter 100, a phase splitter controller 402, an amplitude comparator 404, a phase comparator 406 and an integrator 408 that includes an operational amplifier 410 and a capacitor C3. The phase splitter device 400 ensures that a difference in the amplitudes of the in-phase and quadrature outputs are substantially equal to an amplitude set value such as zero (i.e., amplitudes are the same) using a first feedback loop that is formed by the amplitude comparator 404, the phase splitter controller 402 and the phase splitter 100. The phase splitter device 400 also ensures that a phase difference between the in-phase and quadrature outputs is substantially equal to a phase set value (e.g., 90°) by a second feedback loop that is formed by the phase comparator 406, the integrator 408, the phase splitter controller 402 and the phase splitter 100. The first and second feedback loops function concurrently and continuously. The first feedback loop controls the amplitude difference between the in-phase and quadrature outputs by adjusting a common mode of control signals V1 and V2. The second feedback loop controls the phase difference between the in-phase and quadrature outputs by adjusting the differential between the control signals V1 and V2. While the phase splitter device 400 may be implemented for any amplitude and phase set values, the following description assumes that the amplitude and phase set values are zero and 90°, respectively, for ease of discussion.

Figure 4:
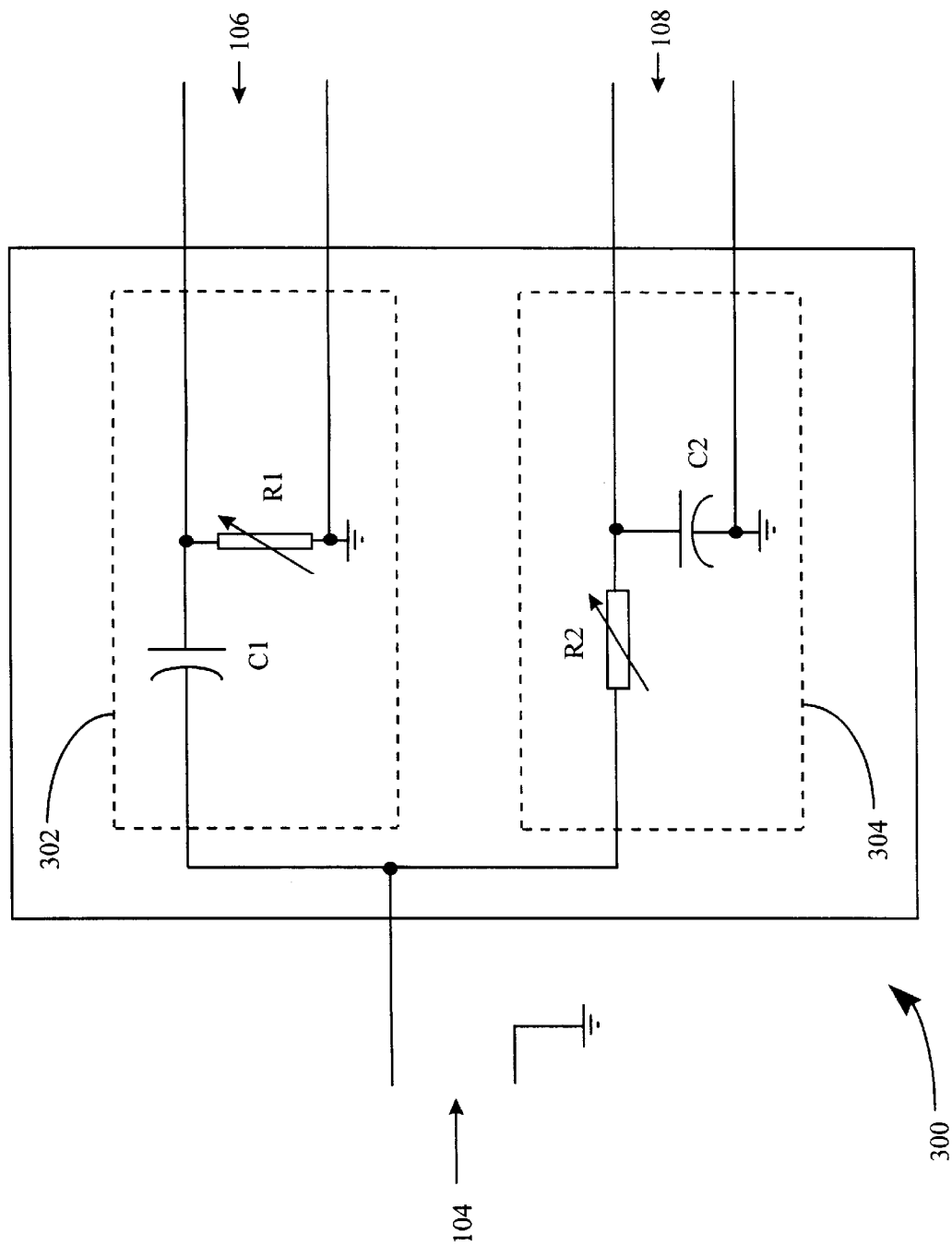
FIG. 4 shows an exemplary circuit diagram for a phase splitter.

FIG. 4 shows an exemplary phase splitter circuit 300 for implementing the phase splitter 100. The phase splitter 300 includes an in-phase output generator 302 and a quadrature output generator 304. Both the in-phase and the quadrature output generators 302 and 304 receive the input signal via the input port 104. The in-phase output generator 302 includes a capacitor C1 and a resistor R1 and the in-phase output is the voltage generated across the resistor R1 which is output through the output port 106. The quadrature output generator 304 includes a resistor R2 and a capacitor C2 and the quadrature output is the voltage across the capacitor C2 which is output through the output port 108.

The transfer functions for the in-phase and the quadrature output generators 302, 304 are provided in equations 1–6 below.

In-Phase: $$H(\omega)_I = \frac{j\omega R1C1}{1+j\omega R1C1} \quad (1)$$

$$\|H(\omega)\|_I = \frac{\omega R1C1}{\sqrt{1+(\omega R1C1)^2}} \quad (2)$$

$$\varphi_I = \tan^{-1}\left(\frac{1}{\omega R1C1}\right) \quad (3)$$

Quadrature: $$H(\omega)_Q = \frac{1}{1+j\omega R2C2} \quad (4)$$

$$\|H(\omega)\|_Q = \frac{1}{\sqrt{1+(\omega R2C2)^2}} \quad (5)$$

$$\varphi_Q = -\tan^{-1}(\omega R2C2) \quad (6)$$

A table below shows magnitudes for the in-phase and quadrature transfer functions for specified values of $\omega RC$ assuming that the in-phase and quadrature output generators have the same values for the respective resistors and capacitors R1C1 and R2C2. In the left-most column, the values for $\omega RC$ increases from zero to infinity. For the quadrature transfer function, the magnitude of the transfer function decreases from 1 to 0 while the phase shift decreases from 0 to −90°. For the same $\omega RC$, the magnitude of the in-phase transfer function increases from 0 to 1 while the phase shift decreases from 90° to 0°.

TABLE

| | $H(\omega)_Q = 1/(1+j\omega RC)$ | | $H(\omega)_I = j\omega RC/(1+j\omega RC)$ | |
|---|---|---|---|---|
| $\omega RC$ | $\|H(\omega)\|_Q$ | $\phi_Q$ | $\|H(\omega)\|_I$ | $\phi_I$ |
| 0 | 1 | 0° | 0 | 90° |
| . | . | . | . | . |
| 0.5 | .894 | −27° | .447 | 63° |

TABLE-continued

| | $H(\omega)_Q = 1/(1+j\omega RC)$ | | $H(\omega)_I = j\omega RC/(1+j\omega RC)$ | |
|---|---|---|---|---|
| $\omega RC$ | $\|H(\omega)\|_Q$ | $\phi_Q$ | $\|H(\omega)\|_I$ | $\phi_I$ |
| 0.8 | .781 | −38.7° | .625 | 51.3° |
| 0.9 | .743 | −42° | .669 | 48° |
| 1.0 | .707 | −45° | .707 | 45° |
| 1.1 | .669 | −48° | .743 | 42° |
| 1.25 | .625 | −51.3° | .781 | 38.7° |
| 2.0 | .447 | −63° | .894 | −27° |
| . | | | | |
| . | | | | |
| ∞ | 0 | −90° | 1 | 0° |

If the phase splitter 300 is initially set so that $\omega RC$ has the value of 1, then the difference in magnitudes of the in-phase and quadrature transfer functions is 0 since both have the same value of 0.707 and the quadrature phase shift is −45° while the in-phase phase shift is 45°. Thus, the phase difference between the in-phase and quadrature outputs is 90°. If the value of $\omega RC$ increases to 1.1, the difference in magnitudes of the in-phase and quadrature transfer functions increases to 0.074 (0.743–0.669) while the phase difference remains at 90° (42°+48°). In fact, for every value of $\omega RC$, the difference between the magnitudes of the transfer functions $H(\omega)_Q$ and $H(\omega)_I$ changes but, the phase difference between the in-phase and quadrature transfer functions remains the same (at 90°).

If the value of $\omega RC$ for the in-phase and quadrature transfer functions are permitted to increment in opposite directions, then the difference in the magnitudes of the respective transfer functions may remain constant while the phase difference between the in-phase and quadrature transfer functions changes. For example, if initially the $\omega RC$ values for the in-phase and quadrature transfer functions are the same at 1.0, the magnitude difference between the in-phase and quadrature transfer functions is 0 while the phase difference is at 90°. If the value of the quadrature $\omega RC$ is increased to 1.1 while the value of the in-phase $\omega RC$ is decreased to 0.9, the magnitude difference between the in-phase and quadrature transfer functions remain at 0 (0.669–0.669). However, the phase difference increases from 90° to 96°. Similarly, if the quadrature $\omega RC$ is decreased to 0.9 and the in-phase $\omega RC$ is increased to 1.1, the difference between the magnitudes of the in-phase and quadrature transfer functions remains at 0 (0.743–0.743) while the phase difference decreases to 84° (42+42).

If the $\omega RC$ corresponding to the in-phase and quadrature transfer functions are initially at different values, and both the in-phase and quadrature $\omega RCs$ are changed about the same amount, the differences in magnitude phase shift may be changed significantly with only small changes in the difference between the in-phase and quadrature transfer functions. If the in-phase and quadrature $\omega RCs$ are changed by the exact same amount (common mode) when the phase difference is approximately 90°, then the percentage change in the amplitude difference between the in-phase and quadrature transfer functions is far greater than the percentage change in the phase difference.

For example, if initially the quadrature $\omega RC$ has the value of 1.0 and the in-phase $\omega RC$ has the value of 0.9, the magnitude difference for the in-phase and quadrature transfer functions is 0.038 (0.707–0.669) and the phase difference is 93° (45+48). If both the in-phase and quadrature $\omega RCs$ are incremented by 0.1, then the magnitude difference between the in-phase and quadrature transfer functions becomes 0.118 (0.743−0.625) while the phase difference becomes 93.3° (42°+51.3°). Thus, the magnitude difference between the in-phase and quadrature transfer functions changed by 211% (100×(0.118−0.038)/0.038) while the phase difference changes by 0.32% (100×(93.3−93)/93).

Therefore, for small common mode ωRC changes in an neighborhood of 90° phase difference, the magnitude difference between the in-phase and quadrature transfer functions may be changed without substantially changing the phase difference. Similarly, if the value of the in-phase and quadrature ωRCs are changed to increase or decrease the difference between the ωRC values (differential mode), the phase difference may be changed while the magnitude difference between the in-phase and quadrature transfer functions may be maintained about the same. Accordingly, the magnitude difference and the phase difference between the in-phase and quadrature transfer functions may be controlled almost completely independently by changing the common or the differential values of the ωRCs for the in-phase and quadrature transfer functions.

Figure 5:
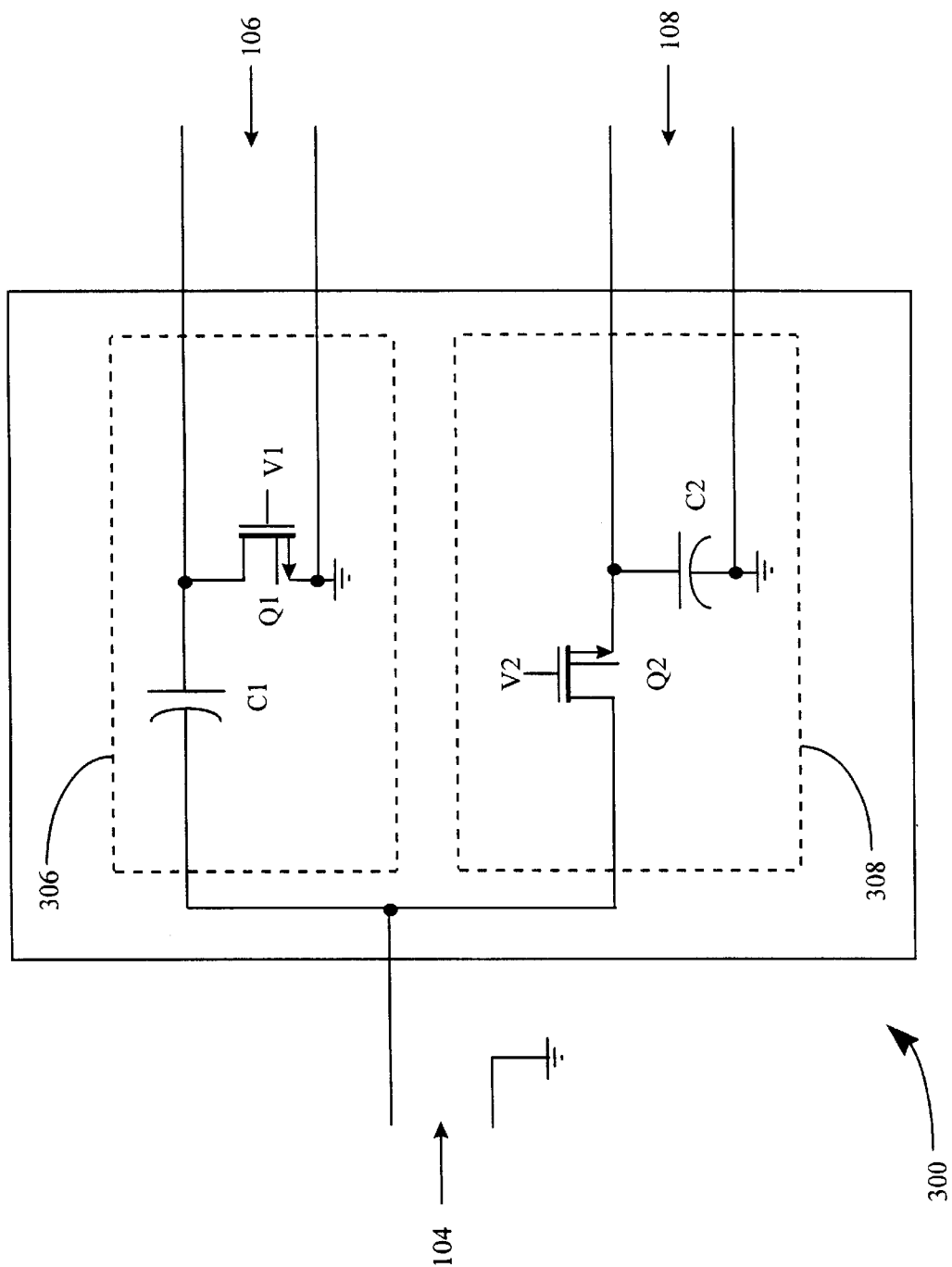
FIG. 5 shows an exemplary circuit diagram for the phase splitter of FIG. 3 using MOSFET transistors.
Figure 6:
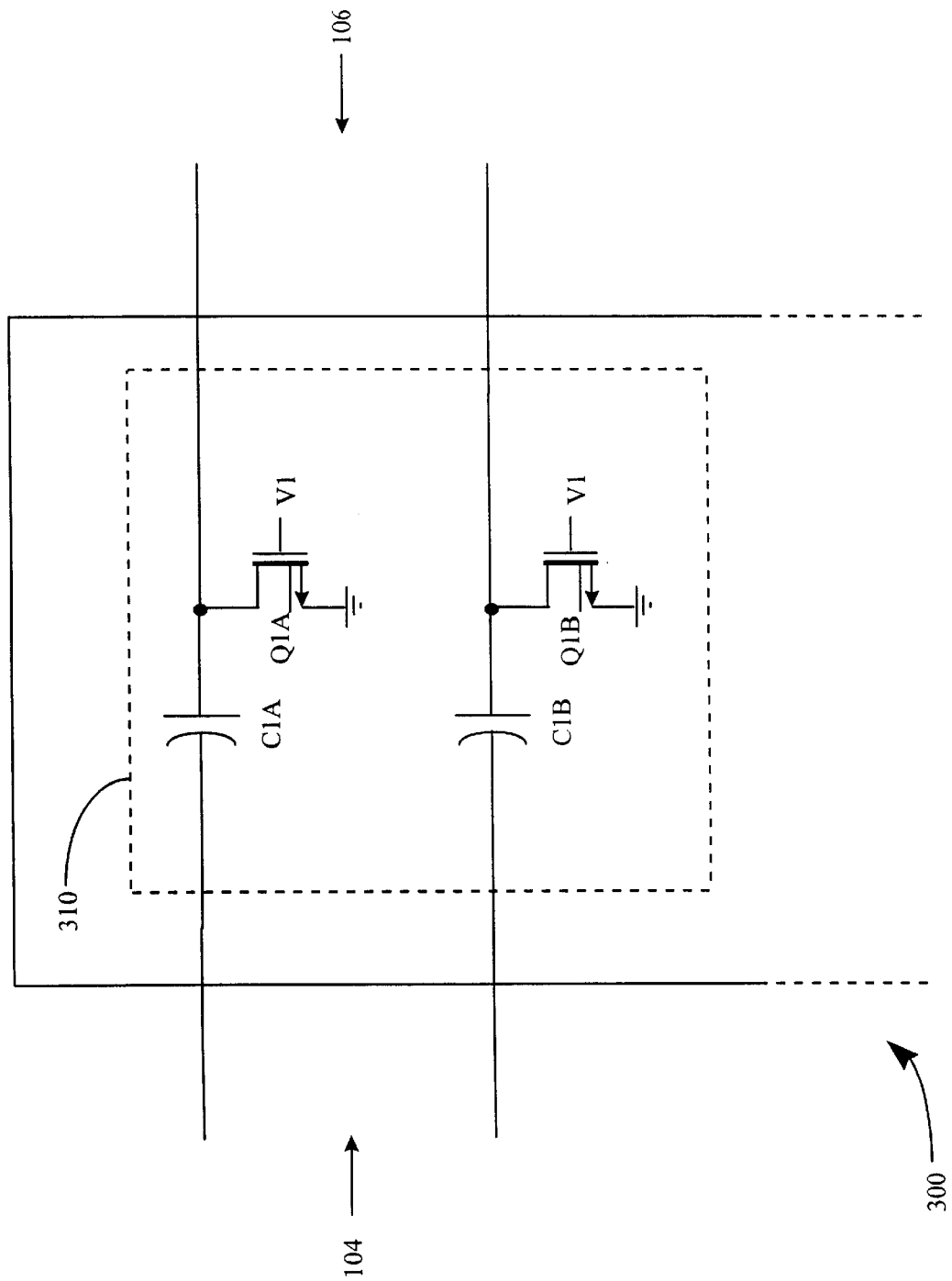
FIG. 6 shows an exemplary diagram of a differential in-phase output generator for the phase splitter.

FIG. 5 shows a specific implementation of the phase splitter 300 where the variable resistors R1 and R2 are replaced by MOSFET transistors Q1 and Q2 that are controlled by the control signals V1 and V2. The transistors Q1 and Q2 operate in the ohmic region and serve as the variable resistors R1 and R2 as shown in FIG. 4. The circuit in FIG. 5 has single ended input and output ports 104–108 because the signals received and transmitted through the ports 104–108 are referenced to ground. While single ended circuits may be used, differential circuits may also be used and may offer better common mode rejection. FIG. 6 shows an example of a differential in-phase output generator 310 and each of the input and output ports 104 and 106 have two output terminals where none of the terminals is directly connected to ground.

Returning to FIG. 3, the amplitude comparator 404 receives both the in-phase and quadrature outputs of the phase splitter 100 and generates an amplitude control signal Amp to change the amplitudes of the in-phase and quadrature outputs so that these outputs may have substantially the same amplitude. The phase splitter controller 402 receives the Amp signal and adjusts the common mode of the control signals V1 and V2. As shown in FIG. 5, the control signals V1 and V2 control the gate voltages of the transistors Q1 and Q2, for example. When a voltage value of the control signal V1 is increased, the ohmic resistance of the transistor Q1 is decreased thus reducing the amplitude of the in-phase output. When the value of the control voltage V2 is increased, the ohmic resistance of the transistor Q2 is also decreased. However, because the transistor Q2 is connected in series between the phase splitter input and the quadrature output, the amplitude of the quadrature output is increased.

Therefore, when the common mode of the control signals V1 and V2 is increased, the amplitude of the in-phase output is decreased and the amplitude of the quadrature output is increased. Conversely, if the common mode of the control signals V1 and V2 is decreased, the amplitude of the in-phase output is increased while the amplitude of the quadrature output is decreased. Thus, by adjusting the common mode of the control signals V1 and V2, the amplitudes of the in-phase and quadrature outputs may be adjusted relative to each other. The adjusted amplitudes of the in-phase and quadrature outputs are fed back to the amplitude comparator 404 to further adjust the Amp signal so that the amplitude of the in-phase and quadrature outputs may be brought closer together until the amplitudes of the in-phase and quadrature outputs are substantially the same.

The second feedback loop includes the phase comparator 406 which inputs the in-phase and quadrature outputs from output ports 106, 108 and compares their phase relationships. The phase comparator 406 generates two output signals VPH1 and VPH2. VPH1 and VPH2 are integrated by the integrator 408 to generate integrated signals PH1 and PH2 which are received by the phase splitter controller 402. The integrated signals PH1 and PH2 control the voltage difference between the control signals V1 and V2. For the phase splitter example of FIG. 5, the control signals V1 and V2 control the ohmic resistance of the transistors Q1 and Q2 corresponding to the in-phase and quadrature output generators 306 and 308.

Assuming that the in-phase and quadrature phase shifts are initially at 42° and −42° (i.e., a phase difference of 84°), then an increase in the voltage of the control signal V1 decreases the ohmic resistance of Q1 which decreases the value of ωR1C1. From the Table above, as the value of ωR1C1 decreases, the in-phase output phase shift $\phi_I$ increases causing an increase in the phase difference between the in-phase and quadrature output. The same effect occurs with a decrease in the control signal V2. The in-phase and quadrature output phases are compared by the phase comparator 406 which results in an adjustment of the VPH1 and VPH2 output signals that reflect the deviation of the phase difference ($|\phi_I-\phi_Q|$) between the in-phase and quadrature outputs.

VPH1 and VPH2 are converted by the operational amplifier 410 to a current drive value that charges or discharges the capacitor C3. If the phase difference $|\phi_I-\phi_Q|$ is not 90°, the difference between the signals VPH1 and VPH2 is not zero thus causing the capacitor C3 to be charged or discharged to change a voltage difference between the PH1 and PH2 signals. The phase splitter controller 402 coverts the integrated signals PH1 and PH2 into a differential between the control signals V1 and V2 that reduce the deviation from the phase difference $|\phi_I-\phi_Q|$ of 90°. If the phase difference $|\phi_I-\phi_Q|$ is 90°, then VPH1=VPH2 and the current drive value is 0. In this case, the charge held by the capacitor C3 remains unchanged resulting in the integrated signals PH1 and PH2 having the same values (e.g., voltages) as before.

Figure 7:
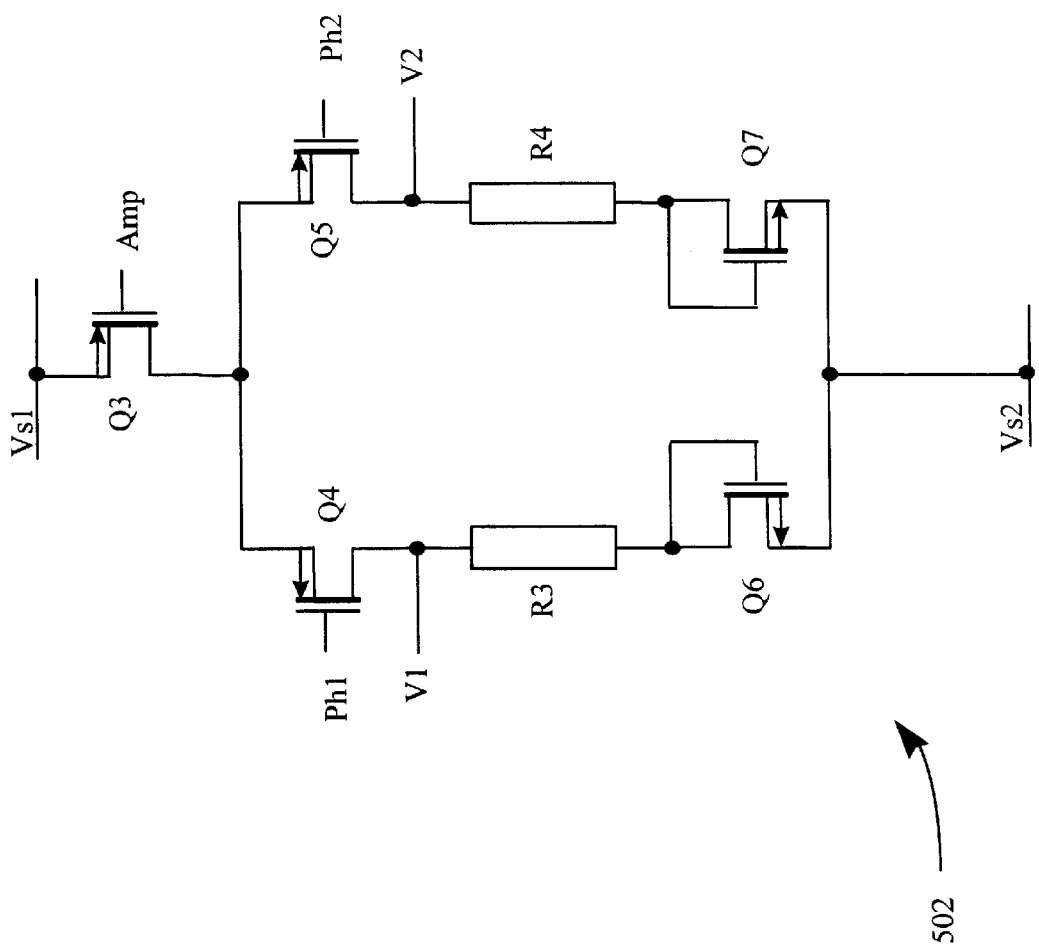
FIG. 7 shows a circuit diagram for a phase splitter controller shown in FIG. 3.

FIG. 7 shows an exemplary circuit 502 for the phase splitter controller 402. The circuit 502 includes transistors Q3–Q7 and resistors R3 and R4 which form a current steering circuit. The transistors Q3–Q7 may be active devices such as MOSFETs (as shown), bipolar transistors or other types of amplifying devices. The circuit 502 receives power from supply lines Vs1 and Vs2. Amp, PH1 and PH2 signals are received as control inputs and the control signals V1 and V2 are outputs.

The transistor Q3 operate as a variable current source. The current flowing through the transistor Q3 is equal to the sum of the currents flowing through the transistors Q4 and Q5. The differential voltage between PH1 and PH2 controls how the current flowing through the transistor Q3 divides between transistors Q4 and Q5.

As the value of the Amp signal changes, the current flowing through the transistor Q3 changes correspondingly. If PH1 and PH2 are equal (i.e., no differential signal), the current divides evenly between Q4 and Q5 so that the voltages of the control signals V1 and V2 change by the same amount. If the Amp signal is kept constant and the differential voltage between PH1 and PH2 are changed (e.g., raise PH1 and lower PH2), then the current flowing the transistor Q4 increases while the current flowing through the transistor Q5 decreases which results in the voltage of control signal V1 to increase and the voltage of the control signal V2 to decrease.

Similarly, if PH1 is lowered while PH2 is raised, the voltage of the control signal V1 decreases and the voltage of control signal V2 increases. Thus, a change in the differential voltage between PH1 and PH2 causes a change in the differential voltage between controls signals V1 and V2. If PH1 and PH2 remain fixed and the Amp signal changes, the common mode voltages of the control signals V1 and V2 change without changing the differential voltage between the control signals V1 and V2. Accordingly, the voltage difference between the PH1 and PH2 signals is reflected in the voltage difference between the control signals V1 and V2. Since the difference between the PH1 and PH2 signals is directly related to the difference between $|\phi_I-\phi_Q|$ and 90°, the difference between the control signals V1 and V2 is controlled by the difference of $|\phi_I-\phi_Q|$ from 90°. Thus, the circuit 502 changes a common mode of the control signals V1 and V2 based on the Amp signal and changes the difference between the control signals V1 and V2 based on the PH1 and PH2 signals, respectively.

The transistors Q6 and Q7 are diode-connected and ensure a constant voltage of between about 0.6 to 0.7 volts from Vs2, the lower supply voltage. These transistors help to raise the voltage levels of the control signals V1 and V2 and to reduce a gain of the circuit 502 by reducing a voltage change across resistors R3 and R4.

Figure 8:
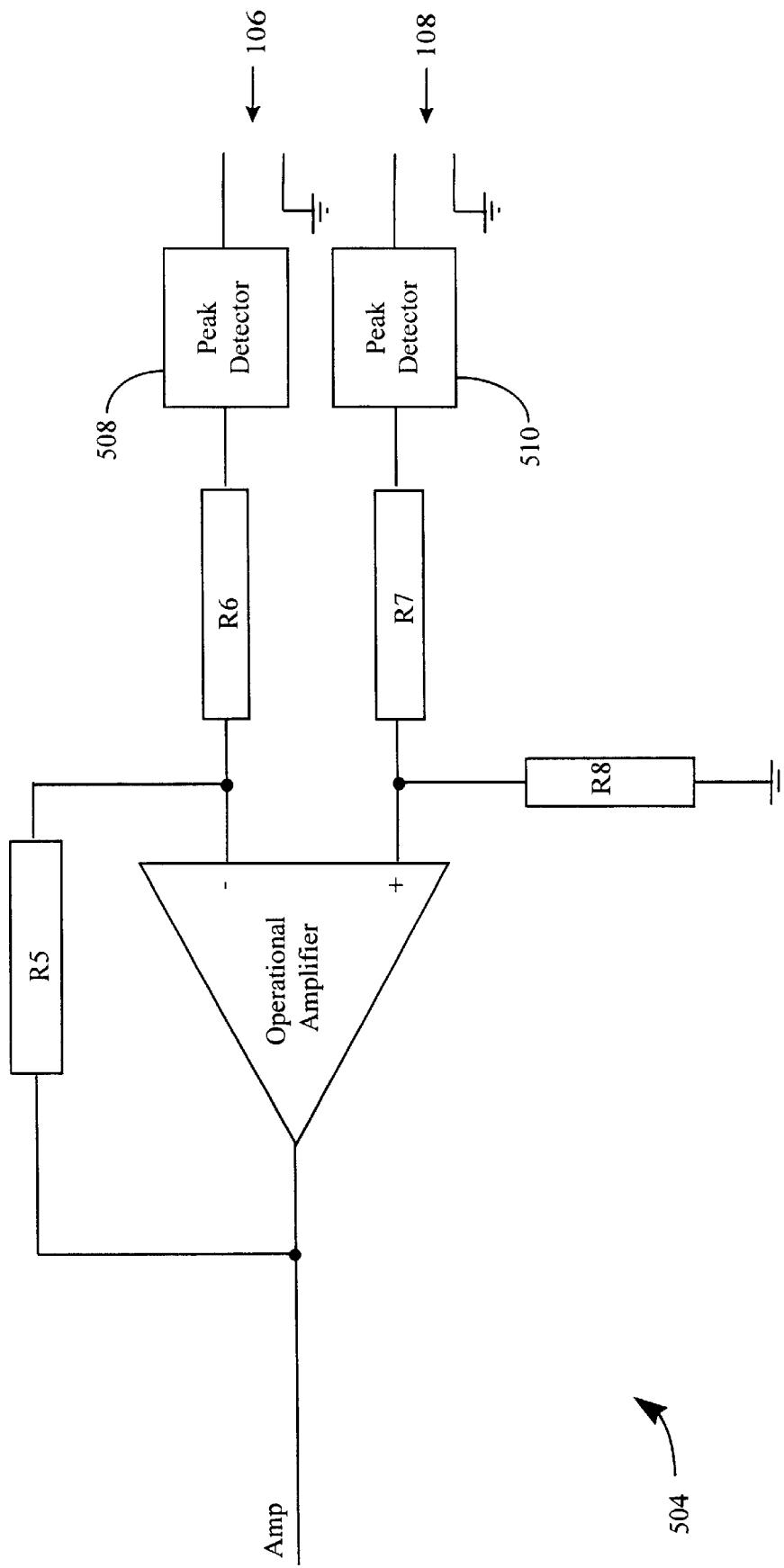
FIG. 8 shows an exemplary circuit diagram for an amplitude comparator shown in FIG. 3.

FIG. 8 shows an exemplary high level diagram for an amplitude comparator 504. The in-phase and quadrature outputs from the output ports 106, 108 are input to respective peak detectors 508 and 510. Outputs of the peak detectors are input to the operational amplifier via the resistors R6 and R7. The resistors R5–R8 together with the operational amplifier forms a differential amplifier so that the difference between the in-phase and quadrature outputs are amplified with a gain g and output as the Amp signal. The gain g may be set to any value by adjusting the values of the resistors R5–R8.

Figure 9:
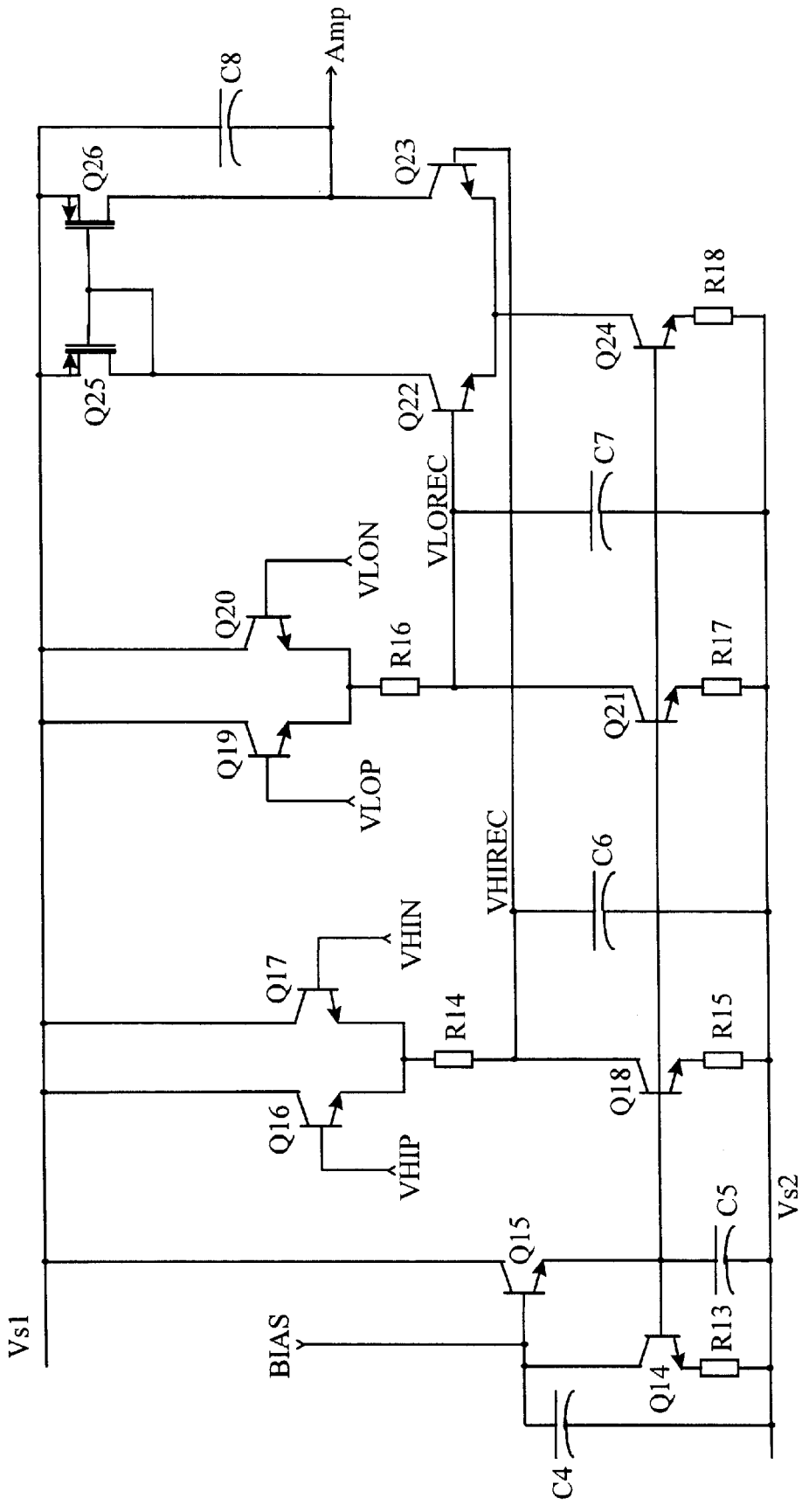
FIG. 9 shows an exemplary circuit diagram for a differential amplitude comparator.

FIG. 9 shows a detailed circuit diagram 505 as an example of the amplitude comparator 504. Components C4, C5, R13, R15, R17, R18, Q14 and Q15 bias transistors Q18, Q21 and Q24. Components Q16 and Q17 receive differential signals of one of the in-phase or quadrature outputs and full wave rectifies the received differential signal. R14 and C6 peak detects the full wave rectified signal to generate VH1REC. Q19 and Q20 full wave rectifies the other one of the differential in-phase and quadrature outputs. R16 and C7 peak detects the full wave rectified signal to generate VLOREC. Components Q22, Q23, Q25 and Q26 charges and discharges the capacitor C8 based on VH1REC and VLOREC to generate the Amp signal.

Functions of the phase comparator 406 may be performed by circuits such as a charge pump circuit that charges or discharges a capacitor based on the phase difference between the in-phase and quadrature outputs. The voltage of the capacitor is compared to a preset voltage set based on the desired phase difference.

Figure 10:
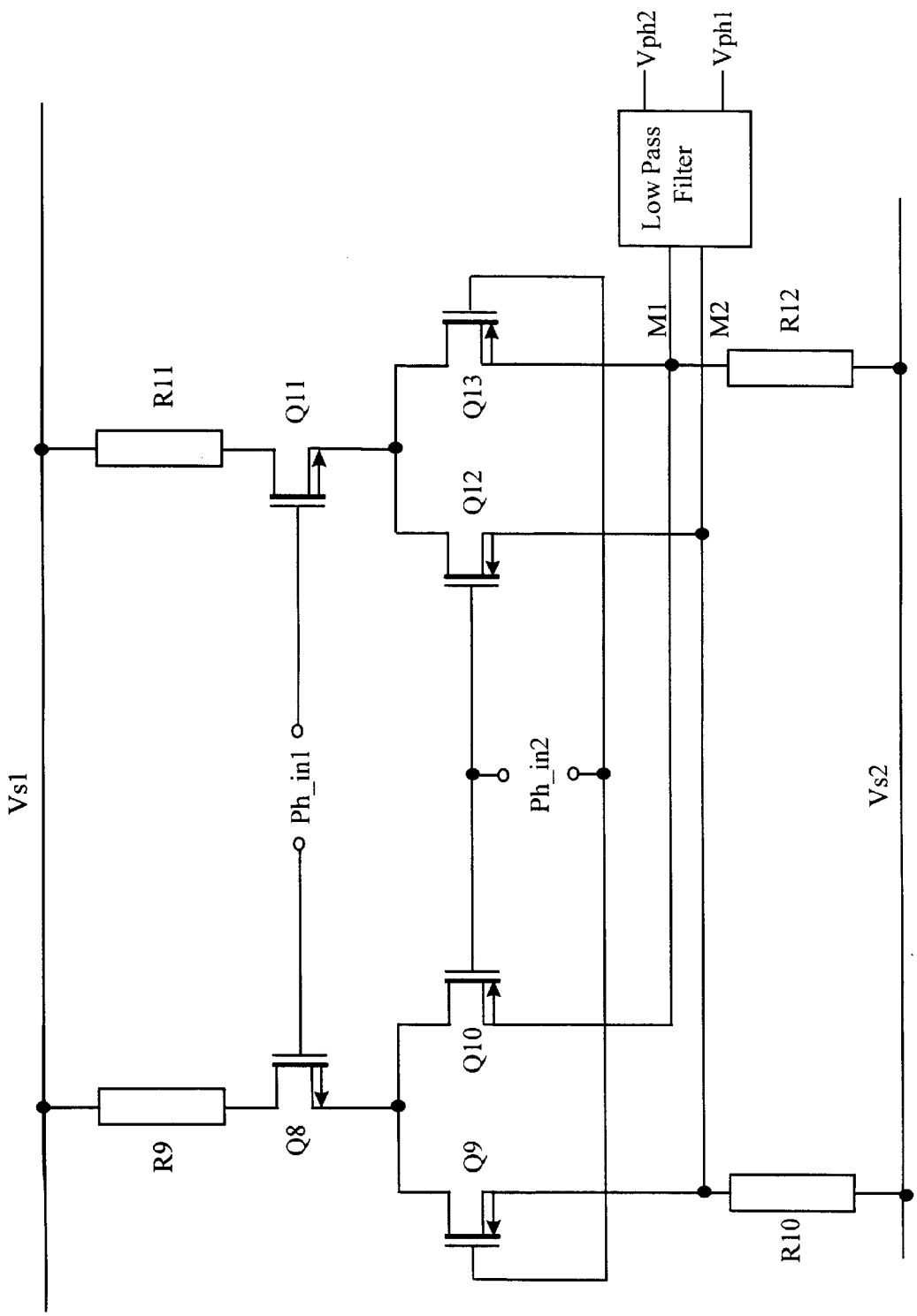
FIG. 10 shows an exemplary circuit diagram for a phase comparator shown in FIG. 3.

The phase comparator 406 may also be implemented by a multiplier circuit followed by a low pass filter. FIG. 10 shows an exemplary circuit diagram for a multiplier type phase comparator 506. The phase comparator 506 performs a multiply function that multiplies inputs PH-IN1 and PH-IN2. The PH-IN1 and PH-IN2 sianals may be connected to the in-phase and quadrature outputs of the output ports 106, 108 of the phase splitter 100. The output of the multiplier is input to a low pass filter to generate the phase comparator outputs VPH1 and VPH2.

The phase comparator 506 includes transistors Q8–Q10 and resistor R9 to form a first differential amplifier and transistors Q11–Q13 and resistor R11 to form a second differential amplifier. The sources of the differential amplifiers are connected to resistors R10 and R12 to generate the output of the multiplier. Transistor Q8 and resistor R9 form a first current source of the first differential amplifier and transistor Q11 and resistor 11 form a second current source for the second differential amplifier. Transistors Q9 and Q10 receive the current from the first current source. The transistors Q12 and Q13 receive current from the second current source. The transistors Q8—Q13 and resistors R9–R12 form a well-known Gilbert cell which multiplies PH-IN1 and PH-IN2 signals to generate a differential output signal between M1 and M2 which represents a product of PH-IN1 and PH-IN2.

If the in-phase output signal is represented by $\cos(\omega)$ and the quadrature output is represented by $\sin(\omega+\Delta)$, where $\Delta$ is the deviation of the in-phase and quadrature output phase difference from 90°, then the output of the multiplier circuit formed by Q8–Q13 and R9–R12 is $\cos(\omega)(\sin(\omega+\Delta))$. By standard trigonometric identities, $\cos(\omega)\sin(\omega+\Delta)$ is equal to $\frac{1}{2}[\sin(2\omega+\Delta)+\sin(\Delta)]$. This multiplication result includes a high frequency component, $\sin(2\omega+\Delta)$ and a low frequency component $\sin(\Delta)$. Thus, if the result of the multiplication is low pass filtered, the high frequency component $\sin(2\omega+\Delta)$ is removed leaving only the low frequency component $\sin(\Delta)$ as the output of the low pass filter. The voltage difference between VPHI and VPH2 is proportional to $\frac{1}{2}\sin(\Delta)$. As is well known, for small values of $\Delta$, $\sin(\Delta)$ is approximately equal to $\Delta$. Thus, the differential output between VPH1 and VPH2 is proportional to $\Delta/2$. As the phase difference between the in-phase and quadrature inputs to the phase comparator goes to 90°, the voltage difference between VPH1 and VPH2 also goes to 0. The output of the phase comparator 506 is integrated by the integrator 408 to generate a voltage difference across the capacitor C3 which is input to the phase splitter controller 402.

Figure 11:
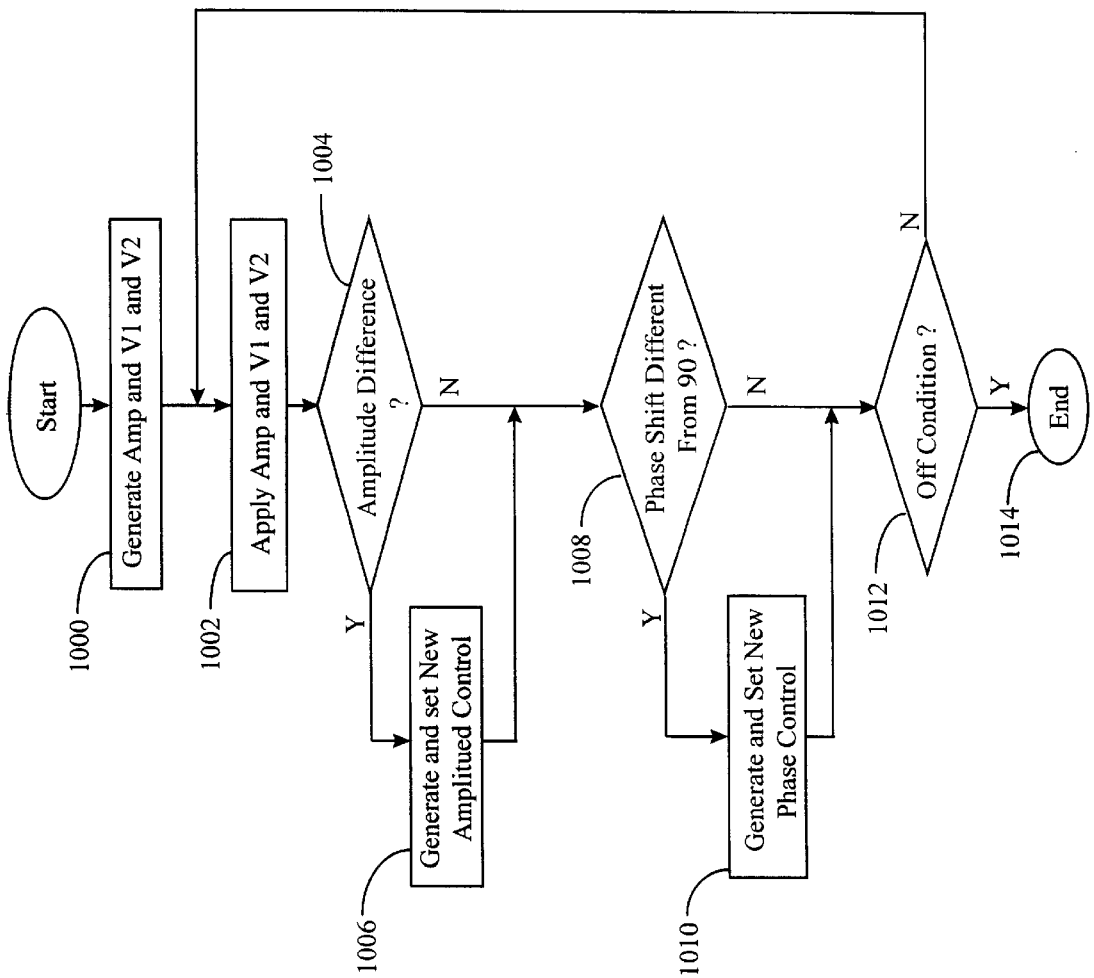
FIG. 11 shows a flowchart for an exemplary process of the phase splitter device.

FIG. 11 shows an exemplary flowchart for the phase splitter device 400. In step 1000, the phase splitter device 400 generates initial values for Amp, V1 and V2 and goes to step 1002. In step 1002, the phase splitter device 400 applies the initial values for Amp, V1 and V2 generated in step 1000 and goes to step 1004. In step 1004, the phase splitter device 400 determines whether there is an amplitude difference between an in-phase and quadrature outputs. If there is a difference, the phase splitter device 400 goes to step 1006; otherwise, the phase splitter device 400 goes to step 1008. In step 1006, the phase splitter device 400 generates a new Amp value to compensate for the differences in the amplitudes of the in-phase and quadrature output amplitudes and applies the new Amp value and goes to step 1008.

In step 1008, the phase splitter device 400 determines whether the phase difference between the in-phase and quadrature outputs has deviated from 90°. If there is a deviation, the phase splitter device 400 goes to step 1010, otherwise, the phase splitter device 400 goes to step 1012. In step 1010, the phase splitter device 400 generates new V1 and V2 values to compensate for any deviation from the 90° phase shift and applies the new V1 and V2 values and goes to step 1012. In step 1012, the phase splitter device 400 determines whether an off condition is detected. If detected, the phase splitter device 400 goes to step 1014 and ends; otherwise, the phase splitter device 400 returns to step 1002.

The above flowchart discusses the functions of the phase splitter device 400 in sequential steps. However, as discussed earlier, the functions of the phase splitter device 400 may be performed concurrently and/or continuously, such as implemented by the circuits shown in FIGS. 3–10. The functions may also be performed by a controller, such as a digital signal processor (DSP), for example, where the speed of the DSP is sufficient to maintain adequate performance of the phase splitter device 400 for the intended application. In such an application, the functions of the phase splitter device 400 may be performed in a sequential manner.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes maybe made without departing from the spirit and scope of the invention.

What is claimed is:

1. A phase splitter device, comprising:
a phase splitter that generates a first output and a second output based on an input; and
a first control device coupled to the phase splitter, the control device ensuring that a phase difference between a first phase of the first output and a second phase of the second output is substantially a first set value, wherein the first control device comprises:
a first feedback loop that includes a phase comparator, the phase comparator generating a phase compare signal that corresponds to a difference between the first set value and the phase difference between the first phase and the second phase, wherein the phase comparator includes one of a continuously variable charge pump device or a multiplier device, the multiplier device including a continuously variable multiplier circuit, a low pass filter and an integrator.

2. The device of claim 1, wherein the phase comparator receives single ended inputs or differential inputs, the phase comparator generating a single ended output or differential outputs.

3. The device of claim 2, further comprising a second control device, the second control device ensuring that a difference between a first amplitude of the first output and a second amplitude of the second output is substantially a second set value.

4. The device of claim 3, wherein the second control device comprises a second feedback loop that includes an amplitude comparator, the amplitude comparator generating an amplitude compare signal that corresponds to a difference between the second set value and an amplitude difference between the first amplitude and the second amplitude.

5. The device of claim 4, further comprising a phase splitter control device coupled to the phase comparator and the amplitude comparator, the phase splitter control device generating phase splitter control signals to control both the first and second amplitudes and the first and second phases.

6. The device of claim 5, wherein a common mode of the phase splitter control signals controls the first and second amplitudes and a difference between the phase splitter control signals controls the first and second phases.

7. The device of claim 7, wherein the phase splitter control device comprises:
a first portion receiving the amplitude compare signal; and
a second portion that receives the phase compare signal, the second portion including a first leg and a second leg, the first and second legs being combined at a node of the first portion, the amplitude compare signal changing a signal value of the node and the phase compare signal changing a first control signal and a second control signal generated by the first and second legs, respectively.

8. The device of claim 7, wherein the phase splitter control signals comprise the first control signal and the second control signal, a change in the signal value of the node of the first portion changes a common mode of the phase splitter control signals by making a same change in the values of the first and second control signals, a change in the phase compare signal changing the difference between the phase splitter control signals by changing a difference between the first and second control signals.

9. The device of claim 5, wherein the phase splitter control device comprises a current steering circuit, the current steering circuit including;
a first portion that includes a first transistor, the amplitude compare signal being input to the first transistor; and
a second portion that includes two legs, each of the legs including a second transistor and a resistor, the phase compare signal being a first compare signal and a second compare signal, the first compare signal being input to the second transistor of one of the legs and the second compare signal being input to the second transistor of another one of the legs, currents flowing in the first and second legs are combined at a node of the first portion and a sum of the currents flowing through the first transistor, the second transistor and the resistor of each of the legs being connected in series, the second transistors of the legs being connected to the node, the phase splitter control signals including a first output signal generated by the first leg between the second transistor and the resistor of the first leg and a second output signal generated by the second leg between the second transistor and the resistor of the second leg.

10. A method for phase splitting an input signal, comprising:
generating a first output and a second output based on the input;
ensuring that a phase difference between a first phase of the first output and a second phase of the second output is substantially a first set value; and
generating a phase compare signal that corresponds to a difference between the first set value and the phase difference between the first phase and the second phase;
ensuring that an amplitude difference between a first amplitude of the first output and a second amplitude of the second output is substantially a second set value;
generating an amplitude compare signal that corresponds to a difference between the second set value and the amplitude difference between the first amplitude and the second amplitude;
generating phase splitter control signals to control both the first and second amplitudes and the first and second phases, where a common mode of the phase splitter control signals controls the first and second amplitudes and a difference between the phase splitter control signals controls the first and second phases.

11. The method of claim 10, wherein the phase splitter control signals include a first control signal and a second control signal, the method further comprising:
changing the common mode of the phase splitter control signals by changing the first and second control signals by a same amount based on the amplitude compare signal; and
changing the difference between the phase splitter control signals by changing the first and second control signals by different amounts based on the phase compare signal.

12. An integrated circuit comprising a phase splitter device, the phase splitter device including:

a phase splitter that generates a first output and a second output based on an input;

a first control device coupled to the phase splitter, the control device ensuring that a phase difference between a first phase of the first output and a second phase of the second output is substantially a first set value, wherein the first control device comprises a first feedback loop that includes a phase comparator, the phase comparator generating a phase compare signal that corresponds to a difference between the first set value and the phase difference between the first phase and the second phase;

a second control device, the second control device ensuring that an amplitude difference between a first amplitude of the first output and a second amplitude of the second output is substantially a second set value, wherein the second control device comprises a second feedback loop that includes an amplitude comparator, the amplitude comparator generating an amplitude compare signal that corresponds to a difference between the second set value and the amplitude difference between the first amplitude and the second amplitude; and a phase splitter control device coupled to the phase comparator and the amplitude comparator, the phase splitter control device generating phase splitter control signals to control both the first and second amplitudes and the first and second phases.

13. The integrated circuit of claim 12, wherein a common mode of the phase splitter control signals controls the first and second amplitudes and a difference between the phase splitter control signals controls the first and second phases.

* * * * *